US006522564B2

(12) United States Patent
Won

(10) Patent No.: US 6,522,564 B2
(45) Date of Patent: Feb. 18, 2003

(54) SEMICONDUCTOR MEMORY DEVICE AND SIGNAL LINE ARRANGEMENT METHOD THEREOF

(75) Inventor: Jong-Hak Won, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/004,558

(22) Filed: Dec. 3, 2001

(65) Prior Publication Data

US 2002/0105850 A1 Aug. 8, 2002

(30) Foreign Application Priority Data

Feb. 8, 2001 (KR) .......................................... 01-06179

(51) Int. Cl.[7] ................................................. G11C 5/06
(52) U.S. Cl. ............................ 365/63; 365/51; 365/190
(58) Field of Search ............................... 365/63, 69, 51, 365/190

(56) References Cited

U.S. PATENT DOCUMENTS 4,922,459 A * 5/1990 Hidaka ........................ 365/63
5,625,234 A * 4/1997 Suzuki et al. ................. 365/63
6,111,774 A * 8/2000 Shirley ......................... 365/51
6,320,781 B1 * 11/2001 Li et al. ....................... 365/63
6,370,055 B1 * 4/2002 Hanson et al. ................ 365/63

* cited by examiner

*Primary Examiner*—Tan T. Nguyen
(74) *Attorney, Agent, or Firm*—F. Chau & Associates, LLP

(57) ABSTRACT

The present invention discloses a semiconductor memory device and a method of signal line arrangement. The semiconductor memory device comprises a plurality of memory cell array blocks, a number of pairs of local data input/output lines arranged along a longitudinal direction in each of the memory cell array blocks, multiple column selecting signal lines arranged along an orthogonal direction, and a number of twisted pairs of global data input/output lines arranged adjacent to and along the same direction as the column selecting signal line. Therefore, reducing signal coupling among the column selecting signal line and the pair of global data input/output lines.

10 Claims, 8 Drawing Sheets

SEMICONDUCTOR MEMORY DEVICE AND SIGNAL LINE ARRANGEMENT METHOD THEREOF

CROSS REFERENCE

This application claims the benefit of Korean Patent Application No. 2001-6179, filed on Feb. 8, 2001, under 35 U.S.C. § 119, the entirety of which is hereby incorporated by reference.

BACKGROUND OF THE INVENTION

1. Field of the Invention

The present invention relates to a semiconductor memory device, and more particularly to a signal line arrangement method thereof

2. Description of the Related Art

As semiconductor memory devices become highly highly integrated, efficient layout of the memory cells is required. A conventional semiconductor memory device includes a plurality of memory cell array blocks, a plurality of local data input/output line pairs connected to a plurality of the memory cell array blocks, multiple column selecting signal lines and a plurality of global data input/output line pairs arranged in the orthogonal direction with the plurality of local data input/output line pairs. As shown in FIG. 1, the column select signal lines CSL1, CSL2, . . . , CSLn and the plurality of global data input/output line pairs (GIO1 and GIO1B) and (GIO2 and GIO2B) are arranged in the same direction and are located adjacent to each other in the memory cell array. Typically each of the column select signal lines delivers a full swing signal, and the pair of global data input/output lines delivers smaller swing signals. A problem associated with such signal layout is the conflicting of the column select signal to the adjacent global data input/output lines due to coupling capacitance.

For example, the semiconductor memory device of FIG. 1 includes memory cell array blocks such as BL1, BL2, BL3, and BL4, pairs of local data input/output lines such as (LIO1 and LIO1B), (LIO12 and LIO12B), (LIO23 and LIO23B), (LIO34 and LIO34B), and (LIO4 and LIO4B), a word line WL, column selecting signal lines CSL1, CSL2, . . . , CSLn, and pairs of global data input/output lines such as (GIO1 and GIO1B) and (GIO2 and GIO2B). The word line WL is arranged along the direction of the pairs of local data input/output lines LIO1 and LIO1B. The column select signal lines CSL1, CSL2, . . . , CSLn and pairs of global data input/output lines (GIO1 and GIO1B) and (GIO2, and GIO2B) are arranged in a direction orthogonal to the pairs of local data input/output lines LIO1 and LIO1B. Column selecting signal lines CSL1, CSL2, . . . , CSLn are arranged adjacent to pairs of global data input/output lines (GIO1 and GIO1B) and (GIO2 and GIO2B).

Referring to FIG. 2, which is a schematic diagram illustrating coupling capacitances between a column selecting signal line and global data input/output line pair in the conventional semiconductor memory device. The column selecting signal line CSL1 and the global data input/output line pair GIO1 and GIO1B are divided in three parts, and CA1, CB1, CC1, and CD1 are coupling capacitances in the memory cell array block BL1, BL2, BL3, and BL4, respectively, between the column selecting signal line CSL1 and the global data input/output line GIO1. CA2, CB2, CC2, and CD2 are coupling capacitances in the memory cell array block BL1, BL2, BL3, and BL4, respectively, between the global data input/output line pair GIO1 and GIO1B. CA3, CB3, CC3, and CD3 are coupling capacitances in the memory cell array block BL1, BL2, BL3, and BL4, respectively, between the column selecting signal line CSL1 and the inverting global data input/output line GIO1B.

When the column selecting signal line CSL1 is enabled or disabled, the sum of coupling capacitances, CA1+CB1+CC1+CD1, couples the signal of the CSL1 line and affects a signal in the global data input/output line GIO1. If the coupling is severe, the signal of the global data input/output line GIO1 can change according to the signal change of the column selecting signal line CSL1.

In the same way, when the column selecting signal line CSL1 is enabled and/or disabled, the signal of the inverting global data input/output line GIO1B can change according to the signal change of the column selecting signal line CSL1. However, the inverting global data input/output line GIO1B is located farther than the global data input/output line GIO1 from the column selecting signal line CSL1, the effect of CSL1 on the inverting global data input/output line GIO1B is less than the signal of the global data input/output line GIO1.

Referring to FIG. 3, which is an operation-timing diagram of the memory cell array block BL1 of FIG. 1, and more particularly illustrating a case that an inverting write enable signal WEB of "high" logic level is applied and data of "low" logic level is read from pairs of bit lines BLP1 and BLP2.

A row address X is inputted in response to a row address strobe signal RASB of "low" logic level, and a column address Y is inputted in response to a column address strobe signal CASB of "low" logic level. By decoding the row address X, a word line enable signal WL of "high" logic level is generated, and also block selecting signals BLS 1 and BLS 12 of "high" logic level are generated. By decoding the column address Y, a control signal of "high" logic level in the column selecting signal line CSL1 is generated. In addition, the precharge signal PRE of "low" logic level is generated before the word line enable signal WL of "high" logic level is generated. In response to the precharge signal PRE of "low" logic level, pairs of bit lines BLP1 and BLP2, pairs of local data input/output lines LIO1, LIO1B, LIO2, and LIO2B, and pairs of global data input/output lines (GIO1 and GIO1B) and (GIO2 and GIO2B) are precharged.

When the word line enable signal WL of "high" logic level starts to generate, each pair of bit lines BLP1 and BLP2 begins to develop toward "high" logic level and "low" logic level, respectively.

When the control signal of "high" logic level in the column selecting signal line CSL1 of is generated, data of pairs of bit lines BLP1 and BLP2 are transmitted to pairs of local data input/output lines (LIO1 and LIO1B) and (LIO12 and LIO12B). In response to block selecting signals BLS1 and BLS2, data in pairs of local data input/output lines (LIO1 and LIO1B) and (LIO12 and LIO12B) are transmitted to corresponding pairs of global data input/output lines (GIO1 and GIO1B) and (GIO2 and GIO2B), and are amplified by input/output sense amplifiers.

When data in each pair of global data input/output lines (GIO1 and GIO1B) and (GIO2 and GIO2B) start to develop toward "high" logic level and "low" logic level, the input/output sense amplifiers detect a voltage difference of the data transmitted to pairs of global data input/output lines (GIO1 and GIO1B) and (GIO2 and GIO2B), and then amplify the voltage difference. Therefore, the faster the starting time developing toward "high" logic level and "low" logic level in data transmission to pairs of global data input/output lines (GIO1 and GIO1B) and (GIO2 and GIO2B), the faster the data read access time.

However, the conventional semiconductor memory device arranges the column selecting signal line CSL1 and the global data input/output line GIO1 adjacently as shown in FIG. 2. Therefore, the coupling capacitances between the column selecting signal line CSL1 and the global data input/output line GIO1 affect data transmitting to a pair of global data input/output lines GIO1 and GIO1B. In other words, a full swing to "high" logic level in the column selecting signal line CSL1 increases a voltage of a ΔV1 level in the global data input/output line GIO1. A transition to "low" logic level in the column selecting signal line CSL1 lowers a voltage of a ΔV1 level in the global data input/output line GIO1. On the other hand, the voltage of the inverting global data input/output line GIO1B is increased slightly.

In other words, when a signal in the column selecting signal line CSL1 is enabled and disabled, data of global data input/output line GIO1 is affected changed due to a large coupling capacitance between the column selecting signal line CSL1 and the global data input/output line GIO1. Therefore, the starting point of valid data appearance of the pair of global data input/output lines GIO1 and GIO1B is delayed around ΔT1, thereby delaying a read data access time.

SUMMARY OF THE INVENTION

To overcome the above described problems, preferred embodiments of the present invention provide a semiconductor memory device reducing a coupling capacitance between a column selecting signal line and a pair of a global data input/output line so that a read data access time can be improved.

To achieve the above object, the semiconductor memory device of the present invention comprises a plurality of memory cell array blocks, a certain numbers of pairs of local data input/output lines in a plurality of the memory cell array blocks, multiple column selecting signal lines arranged in the orthogonal direction of pairs of local data input/output lines, and a number of pairs of global data input/output lines that a pair of global data input/output lines twists at least more than once to be arranged adjacently in the same direction with the column selecting signal line.

According to an alternative preferred embodiment of the present invention, the semiconductor memory device of the present invention provides a method of signal line arrangement comprising a plurality of memory cell array blocks, a certain numbers of pairs of local data input/output lines in a plurality of the memory cell array blocks, multiple column selecting signal lines arranged in the orthogonal direction of pairs of local data input/output lines, and a certain numbers of pairs of global data input/output lines that a pair of global data input/output lines twists at least more than once to be adjacently in the same direction with the column selecting signal line.

BRIEF DESCRIPTION OF THE DRAWINGS

For a more complete understanding of the present invention and advantages thereof, reference is now made to the following descriptions taken in conjunction with the accompanying drawings, in which like reference numerals denote like parts, and in which.

DETAILED DESCRIPTION OF PREFERRED EMBODIMENTS

Reference will now be made in detail to preferred embodiments of the present invention, example of which is illustrated in the accompanying drawings.

Figure 5:
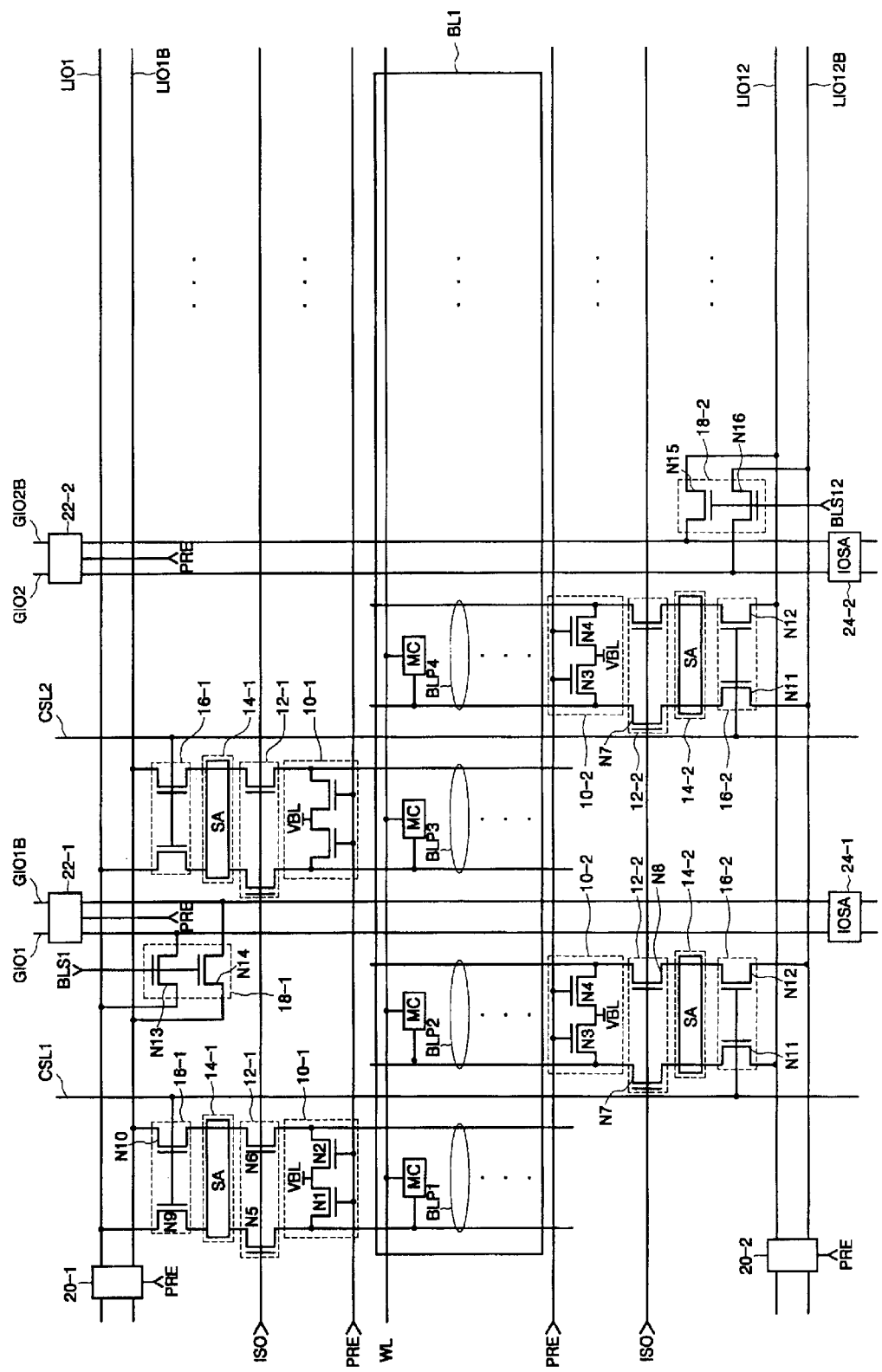
FIG. 5 is a circuit diagram of a memory cell array block BL1 of FIG. 1.

FIG. 5 is a block diagram illustrating a configuration of a semiconductor memory device according to a preferred embodiment of the present invention.

The semiconductor memory device includes a plurality of memory cell array blocks such as BL1, BL2, BL3, and BL4, twisted pairs of the global data input/output lines (GIO1, GIO1B) and (GIO2, and GIO2B), a word line WL, column selecting signal lines CSL1, CSL2, . . . , and CSLn. Memory cell array blocks BL1 and BL2 commonly share the pair of local data input/output lines LIO12 and LIO12B, memory cell array blocks BL2 and BL3 share the pair of local data input/output lines LIO23 and LIO23B, and memory cell array blocks BL3 and BL4 share the pair of local data input/output lines LIO34 and LIO34B.

Figure 4:
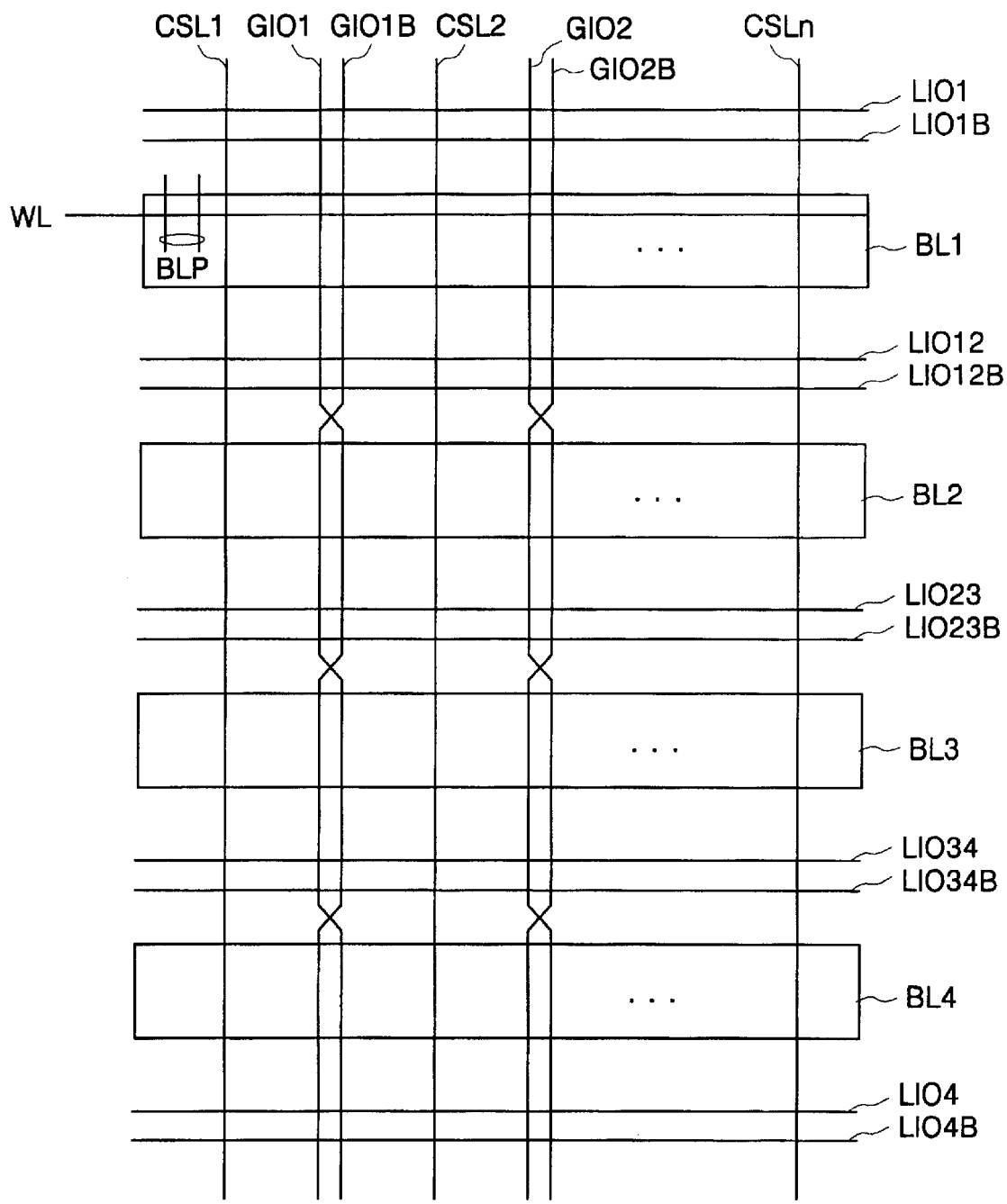
FIG. 4 is a block diagram illustrating a configuration of a semiconductor memory device according to the preferred embodiment of the present invention.

The pair of local data input/output lines LIO1 and LIO1B are arranged adjacent the memory cell array block BL1, and the pair of local data input/output LIO4 and LIO4B are arranged adjacent the memory cell array block BL4. The word line WL is arranged in the pairs of local data input/output lines LIO1 and LIO1B direction. The column selecting signal lines CSL1, CSL2, . . . , CSLn are arranged in the orthogonal direction of the pairs of local data input/output lines LIO1 and LIO1B. Pairs of global data input/output lines (GIO1 and GIO11B) and (GIO2 and GIO2B) are also arranged in the orthogonal direction of the pairs of local data input/output lines LIO1 and LIO1B. However, the pair of global data input/output lines are twisted, which is different from those in the conventional semiconductor device. For example, the pair of global input /output lines GIO1 and GIO1B are twisted to form a twisted pair of global input /output lines GIO2 and GIO2B. Even though FIG. 4 illustrates three twisted pair portions of the global data input/output lines (GIO1 and GIO1B) and (GIO2 and GIO2B) in a preferred embodiment of the present invention, at least one twisted configuration in pairs of the global data input/output lines (GIO1 and GIO11B) and (GIO2 and GIO2B) has the same effects illustrated in the present invention. In addition, even though FIG. 4 illustrates pairs of the global data input/output lines (GIO1 and GIO1B) and (GIO2 and GIO2B) twisted among the memory cell array blocks BL1, BL2, BL3, and BL4, there is no limit basically in twisting points of pairs of the global data input/output lines (GIO1 and GIO1B) and (GIO2 and GIO2B). In other words, the present invention has the same effects in regardless of numbers of twist and positions of twist.

FIG. 5 is a circuit diagram of the memory cell array block BL1 and the vicinity of BL1 of FIG. 4. The memory cell array block BL1 includes numerous memory cells MC. Circuits associated with BL1 include precharge circuits 10-1, 10-2, 20-1, 20-2, 22-1, and 22-2, bit line isolation circuits 12-1and 12-2, bit line sense amplifiers 14-1 and 14-2, column selecting gates 16-1and 16-2, switching circuits 18-1 and 18-2, input/output sense amplifiers IOSA 24-1 and 24-2.

Each of memory cells MC is connected to a word line WL and connected to each corresponding pair of bit lines BLP1, BLP2, BLP3, and BLP4. The precharge circuit 10-1 is connected between each pair of bit lines BLP1 and BLP3, and the precharge circuit 10-2 is connected between each pair of bit lines BLP2 and BLP4. Each of precharge circuits 20-1 and 20-2 is connected to each corresponding pair of local data input/output lines (LIO1 and LIO1B) and (LIO12 and LIO12B). Each of precharge circuits 22-1 and 22-2 is connected to each corresponding pair of global data input/output lines (GIO1 and GIOB) and (GIO2 and GIO2B). The switching circuit 18-1 connects the pair of local data input/output lines LIO1 and LIO1B to the pair of global data input/output lines GIO1 and GIO1B, and the switching circuit 18-2 connects the pair of local data input/output lines LIO2 and LIO2B to the pair of global data input/output lines GIO2 and GIO2B.

The precharge circuit 10-1 includes NMOS transistors N1 and N2, and the precharge circuit 10-2 includes NMOS transistors N3 and N4. Precharge circuits 10-1 and 10-2 precharge pairs of bit lines BLP1 and BLP2 in response to a precharge signal PRE of "high" logic level. Then, pairs of bit lines BLP1 and BLP2 are applied in a precharge voltage VBL of lower level than that of a power voltage and higher level than that of a ground level. Configurations of precharge circuits 20-1, 20-2, 22-1, and 22-2 are not illustrated in FIG. 5, but are the same like that of the pre-charge circuit 10-1. Precharge circuits 20-1, 20-2, 22-1, and 22-2 precharge pairs of local data input/output lines (LIO1 and LIO1B) and (LIO12 and LIO12B), and pairs of global data input/output lines (GIO1 and GIO1B) and (GIO2 and GIO2B) in response to the precharge signal PRE of a "low" logic level.

The bit line isolation circuit 12-1 includes NMOS transistors N5 and N6. The bit line isolation circuit 12-2 includes NMOS transistors N7 and N8. Each of bit line isolation circuits 12-1 and 12-2 isolates each corresponding pair of bit lines BLP1 and BLP2 in response to an isolation signal ISO of "low" logic level, and connects each corresponding pair of bit lines BLP1 and BLP2 in response to an isolation signal ISO of "high" logic level.

Each of sense amplifiers 14-1 and 14-2 amplifies each corresponding pair of bit lines BLP1 and BLP2. Configurations of each sense amplifier 14-1 and 14-2 are not illustrated in FIG. 5, but includes a PMOS bit line sense amplifier and a NMOS bit line sense amplifier, in general.

The column selecting gate 16-1 including NMOS transistors N9 and N10 transmits data to the bit line BLP1 and to the pair of local data input/output lines LIO1 and LIO1B in response to a column selecting signal of "high" logic level applied from the column selecting signal line CSL 1. The column selecting gate 16-2 including NMOS transistors N11 and N12 transmits data to the pair of bit lines BLP2 and to the pair of local data input/output lines LIO2 and LIO2B in response to a column selecting signal of "high" logic level applied from the column selecting signal line CSL1.

The switching circuit 18-1 comprising NMOS transistors N13 and N14, transmits data to the pair of local data input/output lines LIO1 and LIO1B and to the pair of global data input/output lines GIO1 and GIO1B in response to a block selecting signal BLS1 of "high" logic level. The switching circuit 18-2 comprising NMOS transistors N15 and N16, transmits data to the pair of local data input/output lines LIO12 and LIO12B and to the pair of global data input/output lines GIO2 and GIO2B in response to a block selecting signal BLS12 of "high" logic level.

Input/output sense amplifiers 24-1 and 24-2 amplify data transmitted to each pair of global data input/output lines (GIO1 and GIO1B) and (GIO2 and GIO2B).

Figure 6:
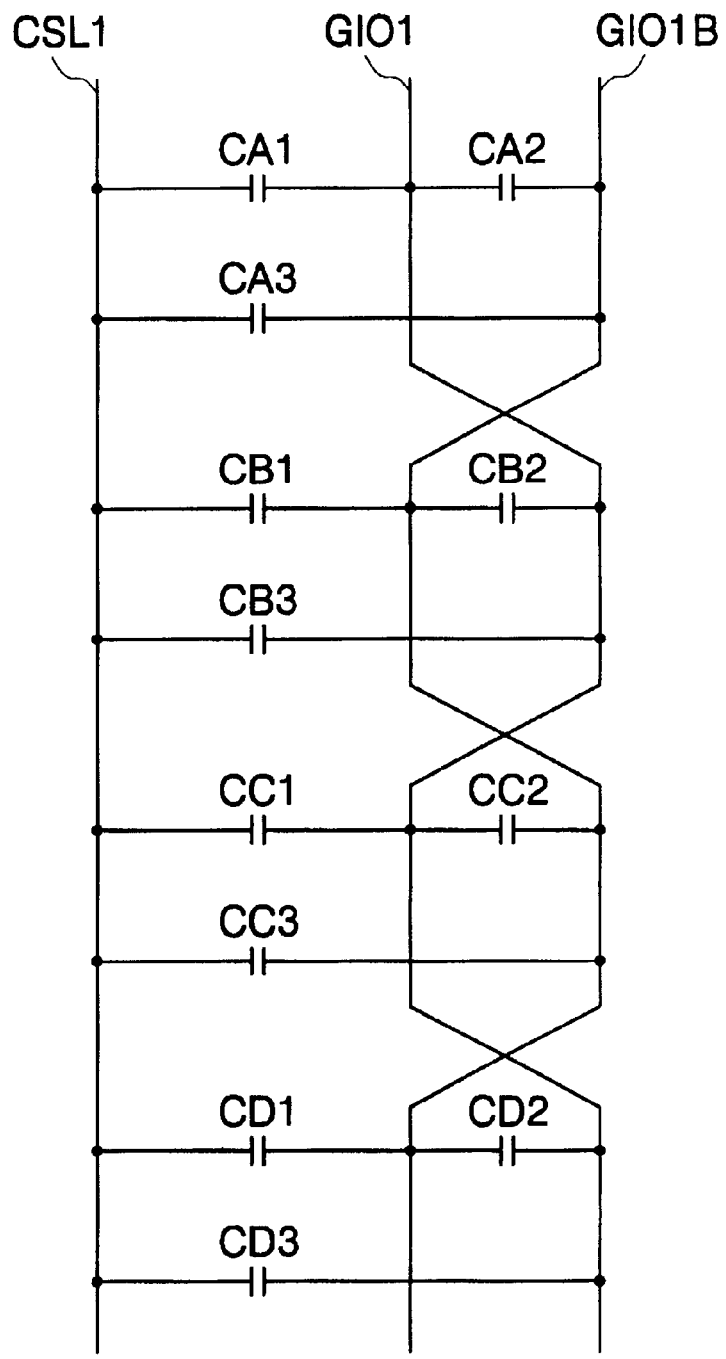
FIG. 6 is a schematic diagram illustrating coupling capacitances among a column selecting signal line and each of the pair of global data input/output line in a semiconductor memory device according to the preferred embodiment of the present invention.

FIG. 6 is a schematic diagram illustrating coupling capacitances among a column selecting signal line and each of the pair of global data input/output line in a semiconductor memory device according to a preferred embodiment of the present invention. The column selecting signal line CSL1 and the global data input/output line pair GIO1 and GIO1B are divided into three parts. CA1, CB3, CC1, and CD3 are coupling capacitances between the column selecting signal line CSL1 and the global data input/output line GIO1 in the memory cell array blocks BL1, BL2, BL3, and BL4, respectively. CA3, CB1, CC3, and CD1 are coupling capacitances between the column selecting signal line CSL1 and the inverting global data input/output line GIO1B in the memory cell array blocks BL1, BL2, BL3, and BL4, respectively. CA2, CB2, CC2, and CD2 are coupling capacitances in the memory cell array block BL1, BL2, BL3, and BL4, respectively, between the global data input/output line pair GIO1 and GIO1B.

Referring to FIG. 6, when the column selecting signal line CSL1 is enabled or disabled, the sum CA1+CC1 of coupling capacitances CA1 and CC1 between the column selecting signal line CSL1 and the global data input/output line GIO1 affects a signal of the global data input/output line GIO1. The sum CB1+CD1 of coupling capacitances CB1 and CD1 between the column selecting signal line CSL1 and the inverting global data input/output line GIO1B affects also a signal of the inverting global data input/output line GIO1B.

Figure 3:
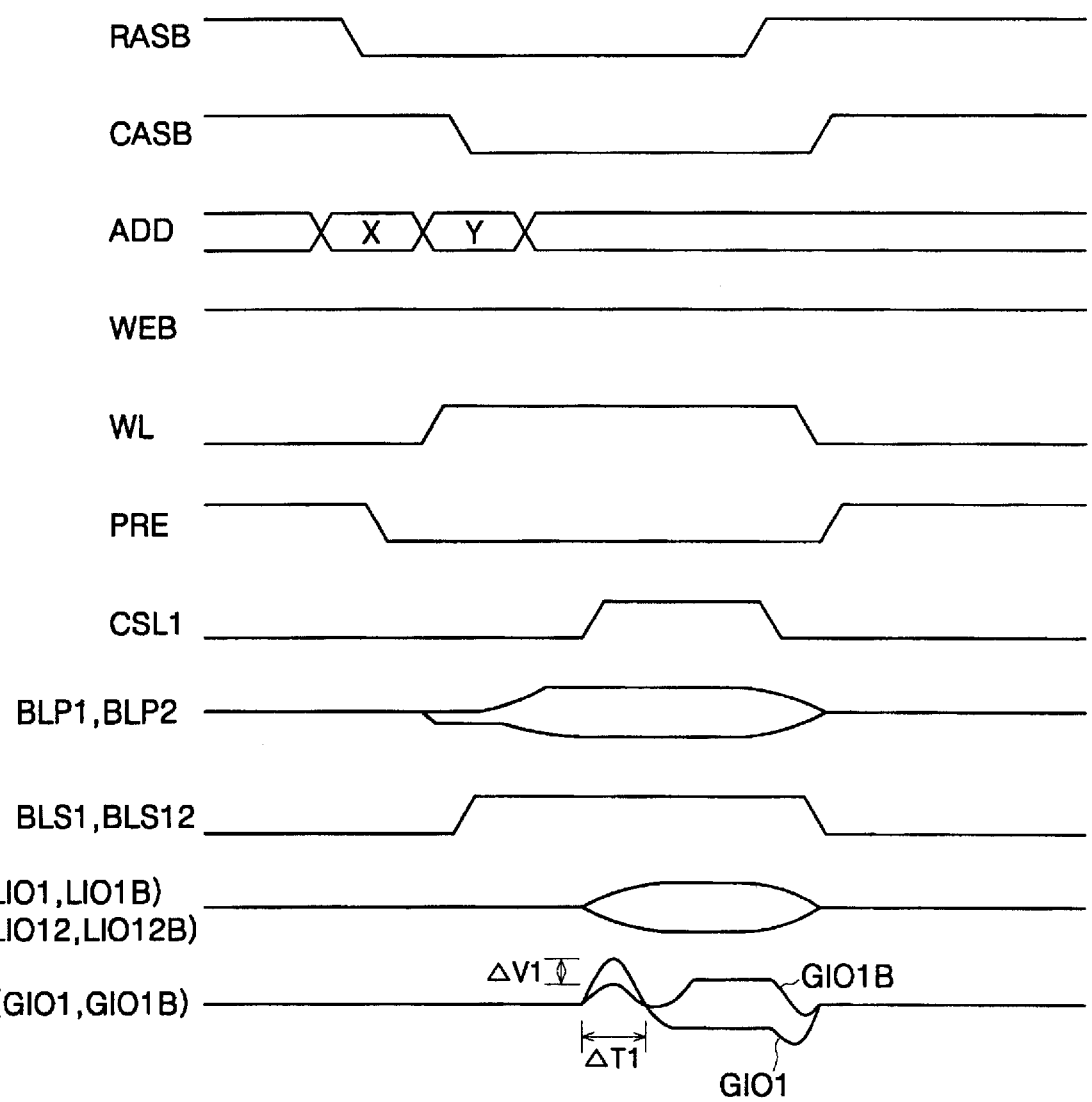
FIG. 3 is an operational timing diagram illustrating operations of a memory cell array block BL1 in FIG. 1.

In the conventional semiconductor memory device shown in FIG. 3, a voltage of the global data input/output line GIO1 rises or falls due to the sum CA1+CB1+CC1+CD1 of all coupling capacitances between the column selecting signal line CSL1 and the global data input/output line GIO1, when the column selecting signal line CSL1 is enabled or disabled.

However, according to a preferred embodiment of the present invention illustrated in FIG. 6, a voltage change of the global data input/output line GIO1 is affected by the sum of coupling capacitances CA1 and CC1, CA1+CC1, between the column selecting signal line CSL1 and the global data input/output line GIO1 when the column selecting signal line CSL1 is enabled or disabled. In addition, the sum of coupling capacitances CB1 and CD1, CB1+CD1, between the column selecting signal line CSL1 and the inverting global data input/output line GIO1B changes a voltage of the inverting global data input/output line GIO1B. Therefore, the voltage changes of a pair of the global data input/output lines GIO1 and GIO1B when the column selecting signal line CSL1 is enabled or disabled is less than that of the conventional semiconductor memory device.

For example, each of coupling capacitances CA1, CB1, CC1, and CD1 between the column selecting signal line CSL1 and the inverting global data input/output line GIO1 is equal to capacitance C, the sum of coupling capacitances between the column selecting signal line CSL1 and the global data input/output line GIO1 is 4C in the conventional semiconductor memory device. On the other hand, the sum of coupling capacitances between the column selecting signal line CSL1 and the global data input/output line GIO1 and the sum of coupling capacitances between the column selecting signal line CSL1 and the inverting global data input/output line GIO1B is 2C in the preferred embodiment of the present invention, respectively Therefore, voltage change of the column selecting signal line CSL1 according to the present invention affects the voltage change of the global data input/output line GIO1 less than that of the conventional semiconductor memory device.

Figure 7:
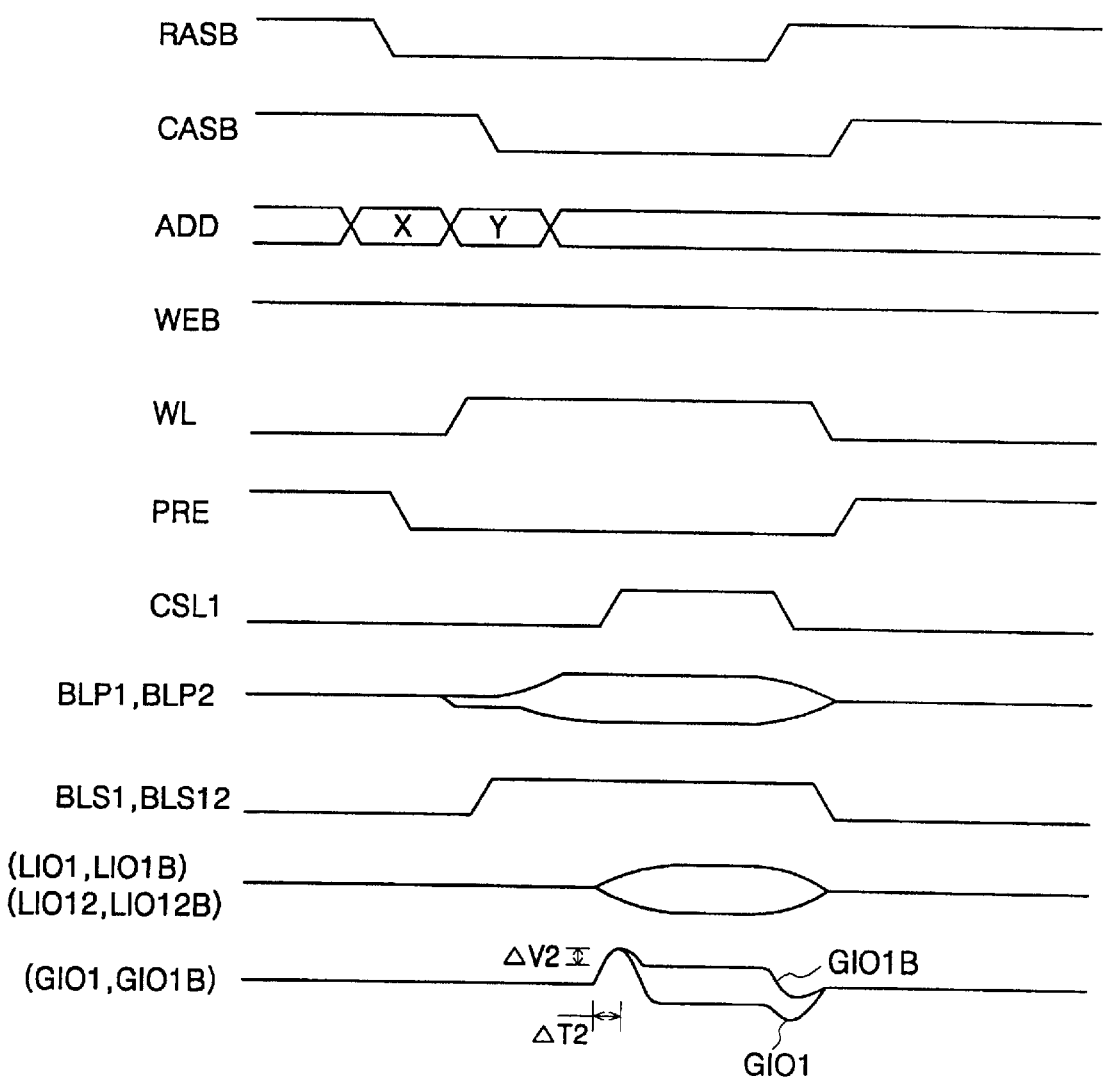
FIG. 7 is an operational timing diagram illustrating an operation of a semiconductor memory device in FIG. 4.

Referring to FIG. 7, which is an operation-timing diagram illustrating an operation of the memory cell array block BL1 of FIG. 4, and more particularly illustrating a case that an inverting write enable signal WEB of "high" logic level is applied and data of "low" logic level is read from pairs of bit lines BLP1 and BLP2.

A row address X is inputted in response to a row address strobe signal RASB of "low" logic level, and a column address Y is inputted in response to a column address strobe signal CASB of "low" logic level. By decoding the row address X, a word line enable signal WL of "high" logic level is generated, and also block selecting signals BLS1 and BLS12 of "high" logic level are generated. By decoding the column address Y, the column selecting signal line CSL1 of "high" logic level is generated. In addition, the precharge signal PRE of "low" logic level is generated before the word line enable signal WL of "high" logic level is generated. In response to the precharge signal PRE of "low" logic level, pairs of bit lines BLP1 and BLP2, pairs of local data input/output lines (LIO1 and LIO1B) and (LIO2 and LIO2B), and pairs of global data input/output lines GIO1, GIO1B, GIO2, GIO2B are precharged.

When the word line enable signal WL of "high" logic level starts to generate, each pair of bit lines BLP1 and BLP2 begins to develop toward "high" logic level and "low" logic level, respectively.

When the column selecting signal line CSL1 of "high" logic level is generated, data of pairs of bit lines BLP1 and BLP2 are transmitted to pairs of local data input/output lines (LIO1 and LIO1B) and (LIO12 and LIO12B). In response to block selecting signals BLS1 and BLS2, data in pairs of local data input/output lines (LIO1 and LIO1B) and (LIO12 and LIO12B) are transmitted to corresponding pairs of global data input/output lines (GIO1 and GIO1B) and (GIO2 and GIO2B), and are amplified by input/output sense amplifiers.

Input/output sense amplifiers detect and amplify a voltage difference of data transmitted to pairs of global data input/output lines (GIO1 and GIO1B) and (GIO2 and GIO2B) when data in each pair of global data input/output lines (GIO1 and GIO1B) and (GIO2 and GIO2B) start to develop toward "high" logic level and "low" logic level.

Data of the pair of global data input/output lines GIO1 and GIO1B illustrated in FIG. 7 are different from the conventional memory device in FIG. 3. Enabling or disabling the column selecting signal line CSL1 raises or decreases a voltage of $\Delta V2$ in the pair of global data input/output lines GIO1 and GIO1B. The voltage difference $\Delta V2$ affected by coupling capacitances of the present invention is less than the voltage difference $\Delta V1$ in the conventional semiconductor memory device in FIG. 3. Therefore, the start time developing both "high" logic level and "low" logic level is reduced from the delay time $\Delta T1$ of the conventional semiconductor memory device to the delay time $\Delta T2$ of the preferred embodiment of the present invention, and the read data access time is much faster than conventional semiconductor memory device.

The detail description of the preferred embodiment of the present invention illustrates a configuration twisting each of the pair of global data input/output lines GIO1 and GIO1B in the case that the pair of global data input/output lines GIO1 and GIO1B is arranged adjacently with the column selecting signal line CSL1.

However, in the case that the global data input/output line GIO1 is arranged adjacently with the column selecting signal line CSL1, and the inverting global data input/output line GIO1B with the column selecting signal line CSL2, the twisting configuration of the pair of global data input/output lines GIO1 and GIO1B can improve the read data access time.

Figure 8:
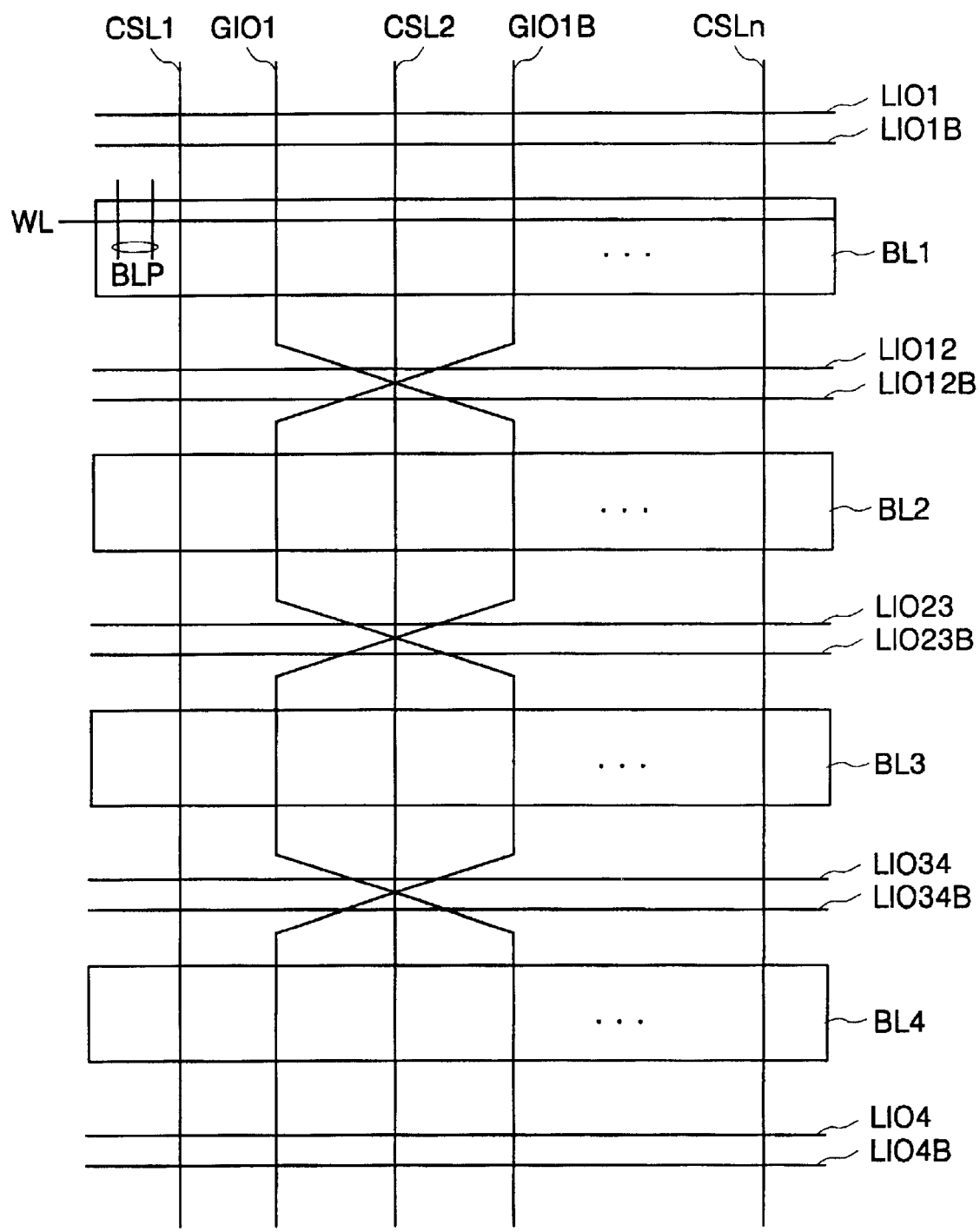
FIG. 8 is a block diagram illustrating a configuration of a semiconductor memory device in an alternative preferred embodiment of the present invention.

FIG. 8 is a block diagram illustrating a configuration of a semiconductor memory device in an alternative preferred embodiment of the present invention. The global data input/output line GIO1 is arranged between each of column selecting signal lines CSL1 and CSL2, the inverting global data input/output line GIO1B is arranged between the column selecting signal line CSL2 and a column selecting signal line CSL3(not shown), and the pair of global data input/output lines GIO1 and GIO1B are twisted.

Figure 1:
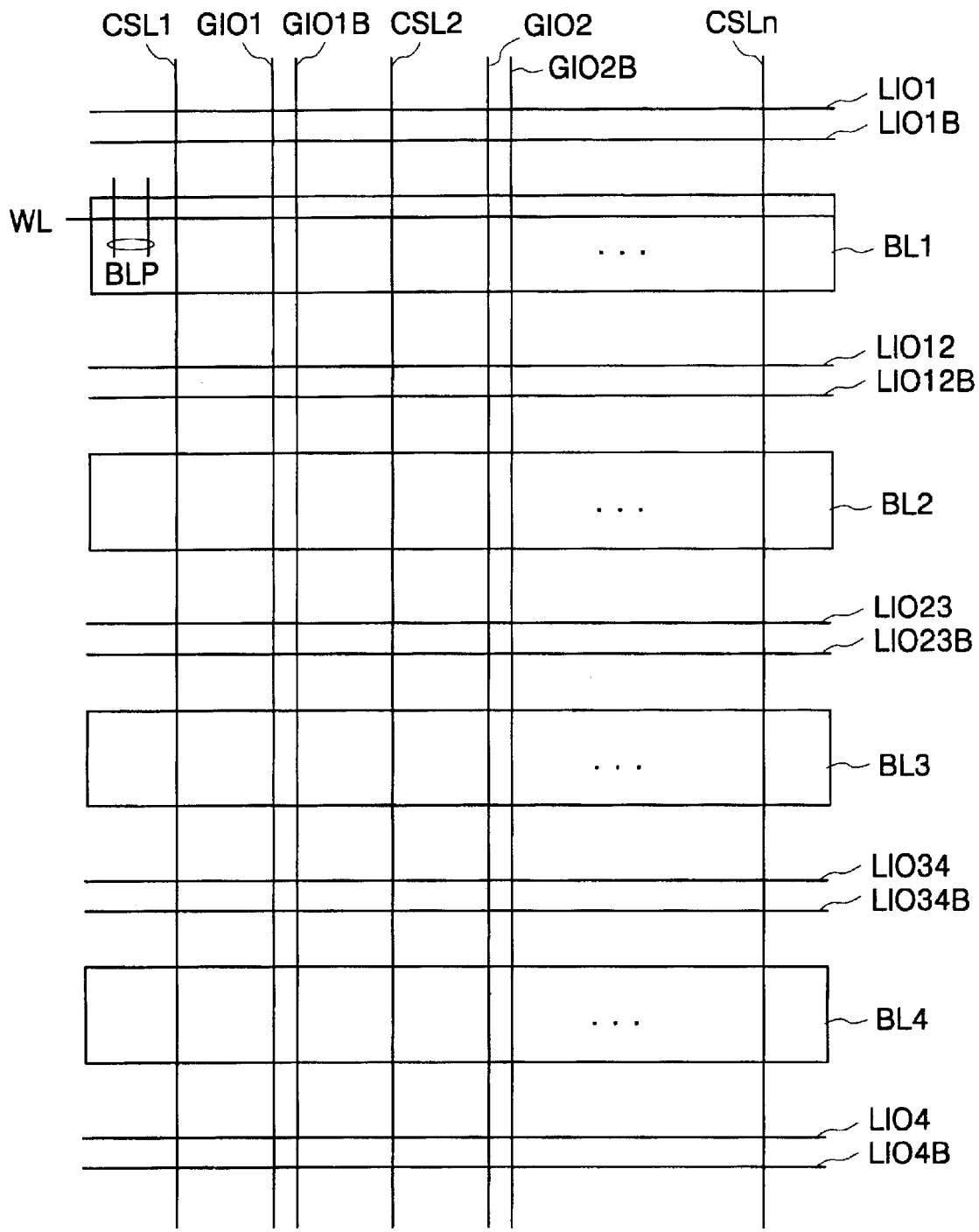
FIG. 1 is a block diagram illustrating a configuration of a conventional semiconductor memory device.
Figure 2:
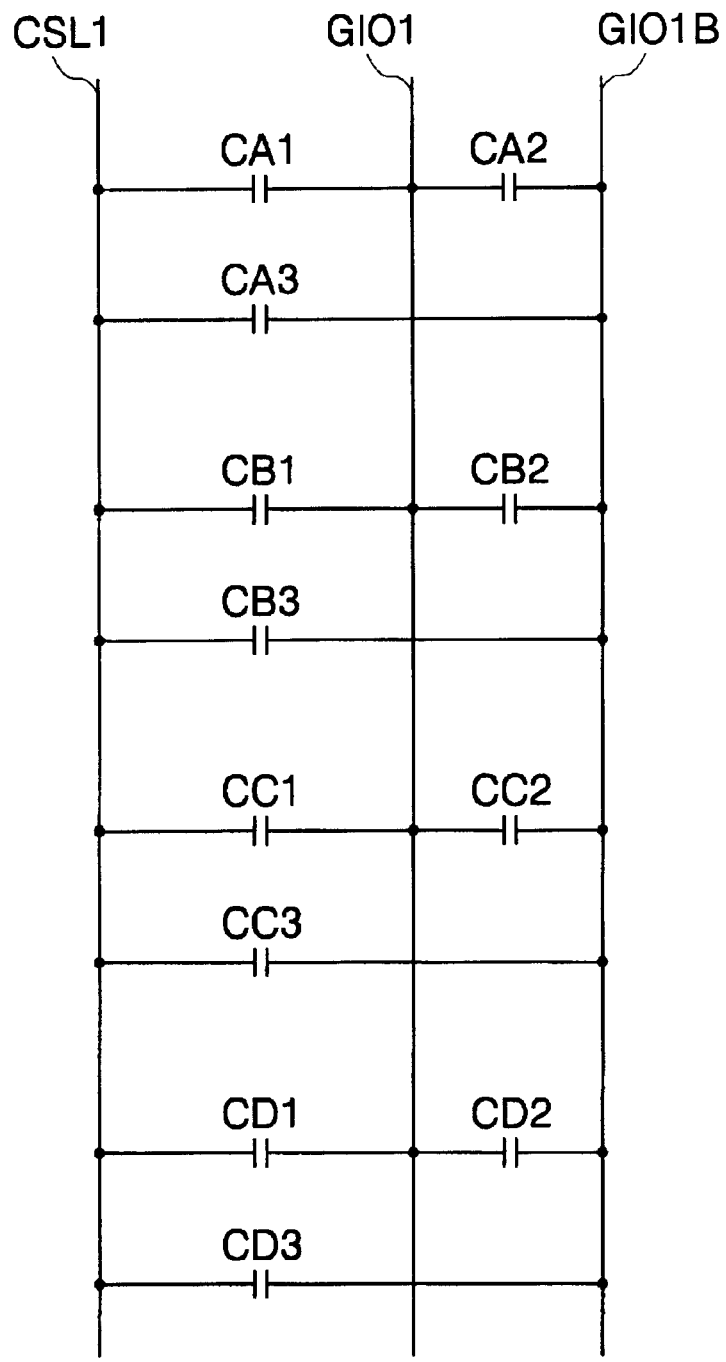
FIG. 2 is a schematic diagram illustrating coupling capacitances among a column selecting signal line and a global data input/output line pair in the conventional semiconductor memory device.

The alternative preferred embodiment of the present invention of FIG. 8 illustrates also a triple twisted configuration of the pair of global data input/output lines GIO1 and GIO1B like the preferred embodiment of the present invention of FIG. 1. The alternative preferred embodiment of the present invention in FIG. 8 can also improve the read data access time like the preferred embodiment of the present invention in FIG. 4.

As a result, the semiconductor memory device and a signal line arrangement method in the present invention are applicable in the case that a pair of global data input/output lines in a small swing is arranged adjacently with a column selecting signal line in a full swing, and are not affected by the arrangement method. In other words, it does not matter whether the pair of global data input/output lines is arranged adjacently with a column selecting signal line or each of the global data input/output line is arranged adjacently with the corresponding each of the column selecting signal line.

In addition, although the preferred embodiment of the present invention is described with the pair of global data input/output lines being located in the periphery area of a memory cell array of a semiconductor memory device, but the pair of global data input/output lines can be arranged in any other place of the memory cell array of the semiconductor memory device.

The semiconductor memory device and the signal line arrangement method in the present invention has a configuration that each of a pair of global data input/output lines in a small swing is arranged adjacently with a column selecting signal line in a full swing, and is twisted at least more than once. Therefore, the semiconductor memory device and the signal line arrangement method in the present invention can prevent a delay time in data transmission to a pair of global data input/output lines, and can improve a read data access time, by reducing coupling capacitances among a column selecting signal line and a pair of global data input/output lines.

Although the present invention has been described herein with reference to the accompany drawings, it is to be understood that the present invention is not limited to those precise embodiments, and various other changes and modifications may be affected therein by one skilled in the art without departing from the scope or sprit of the present invention. All such changes and modifications are intended to be included within the scope of the invention as defined by the appended claims.

What is claimed is:

1. A semiconductor memory device comprising:
   a plurality of memory cell array blocks;
   a predetermined number of pairs of local input/output lines in each of the memory cell array blocks, each pair being arranged along a longitudinal direction;
   a plurality of column selecting signal lines arranged along a direction orthogonal to the longitudinal direction; and
   a predetermined number of pairs of global data input/output lines, wherein each of the pairs of global data input/output lines are twisted to form a twisted pair, and is arranged along the same direction as the column selecting signal lines.

2. The semiconductor memory device according to claim 1, wherein each of the pairs of global data input/output lines is twisted at least once.

3. The semiconductor memory device according to claim 1, wherein the column selecting signal line carries a control signal, and each of the global data input/output line pairs carries a signal having a signal swing smaller than the signal swing of the control signal.

4. The semiconductor memory device according to claim 1, wherein at least one pair of global data input/output lines comprises a global data input/output line and an inverting global data input/output line,
   wherein the global data input/output line and the inverting global data input/output line are arranged on both sides of the column selecting signal line, and are twisted at least once to form a twisted pair of signal line.

5. The semiconductor memory device according to claim 1, wherein at least one of the pairs of global data input/output lines comprises a global data input/output line and an inverting global data input/output line,
   wherein the global data input/output line and the inverting global data input/output line are arranged on one side of the column selecting signal line, and are twisted at least once each other.

6. A signal line arrangement method in a semiconductor memory device having a plurality of memory cell array blocks, comprising:
   a predetermined number of pairs of local input/output line arranged in a first direction in each of the memory cell array blocks;
   a plurality of column selecting signal lines arranged along a second direction, the second direction being orthogonal to the first direction; and
   a predetermined number of pairs of global data input/output lines, wherein the pairs of global data input/output lines are twisted with each other to form twisted pairs, and are arranged along the second direction.

7. The signal line arrangement method according of claim 6, wherein the pair of global data input/output lines are twisted at least once.

8. The signal line arrangement method according of claim 6, wherein the column selecting signal line carries a control signal, and each of the global data input/output line pairs carries a signal having a signal swing smaller than the signal swing of the control signal.

9. The signal line arrangement method according of claim 6, wherein the pair of global data input/output lines comprises a global data input/output line and an inverting global data input/output line,
   wherein the column selecting signal line is disposed between the global data input/output line and the inverting global input/output line, and the pair of global data input/output lines is crossed over to form a twisted pair line.

10. The signal line arrangement method according of claim 6, wherein the pair of global data input/output lines comprise a global data input/output line and an inverting global data input/output line,
    wherein the global data input/output line and the inverting global data input/output line are disposed in one side of the column selecting signal line, and are twisted at least once to form a twisted pair line.

* * * * *